(12) United States Patent  
Baumgartner et al.

(10) Patent No.: US 8,716,786 B2  
(45) Date of Patent: May 6, 2014

(54) SEMICONDUCTOR DEVICE HAVING DIFFERENT FIN WIDTHS

(75) Inventors: Peter Baumgartner, München (DE); Domagoj Siprak, Munich (DE)

(73) Assignee: Infineon Technologies AG (DE)

( * ) Notice: Subject to any disclaimer, the term of this patent is extended or adjusted under 35 U.S.C. 154(b) by 620 days.

(21) Appl. No.: 12/484,682

(22) Filed: Jun. 15, 2009

(65) Prior Publication Data

US 2009/0309162 A1 Dec. 17, 2009

Related U.S. Application Data

(60) Provisional application No. 61/073,183, filed on Jun. 17, 2008.

(51) Int. Cl.  
*H01L 29/76* (2006.01)

(52) U.S. Cl.  
USPC .................... 257/331; 257/E21.703; 438/195

(58) Field of Classification Search  
USPC .......... 257/328, 331, 401, E21.703, E27.112; 438/195  
See application file for complete search history.

(56) References Cited

U.S. PATENT DOCUMENTS

| 7,332,386 | B2 | 2/2008 | Lee et al. | |
| 2004/0110331 | A1 * | 6/2004 | Yeo et al. | 438/199 |
| 2004/0238897 | A1 | 12/2004 | Oishi | |
| 2007/0108528 | A1 | 5/2007 | Anderson et al. | |
| 2007/0259485 | A1 | 11/2007 | Shi et al. | |
| 2007/0284669 | A1 * | 12/2007 | Abadeer et al. | 257/368 |
| 2009/0209074 | A1 * | 8/2009 | Anderson et al. | 438/283 |

FOREIGN PATENT DOCUMENTS

JP 2001298194 A 10/2001

OTHER PUBLICATIONS

Cho, Hye Jin, et al., "Fin width scaling criteria of body-tied FinFET in sub-50 nm regime", *IEEE Conference Digest Device Research Conference*, 2004. 62nd DRC., (2004), 209-210.

Subramanian, V., et al., "Optimization of FinFET geometries for analog performance", Proceedings ULIS—7th European Workshop on Ultimate Integration of Silicon location, (2006), 21-24.

Wambacq, P., et al., "The Potential of FinFETs for Analog and RF Circuit Applications", IEEE Transactions on Circuits and Systems I: Regular Papers, 54(11), (2007), 2541-2551.

"German Application Serial No. 102009025271.1, Office Action mailed Feb. 9, 2012", 14 pgs.

* cited by examiner

*Primary Examiner* — Thomas L Dickey  
(74) *Attorney, Agent, or Firm* — Schwegman, Lundberg & Woessner, P.A.

(57) ABSTRACT

A semiconductor device includes at least one source region and at least one drain region. A plurality of fins extend between a source region and a drain region, wherein at least one fin has a different width than another fin. At least one gate is provided to control current flow through such fins. Fin spacing may be varied in addition to, or alternative to utilizing different fin widths.

21 Claims, 17 Drawing Sheets

SEMICONDUCTOR DEVICE HAVING DIFFERENT FIN WIDTHS

RELATED APPLICATIONS

This patent application claims the benefit of priority, under 35 U.S.C. Section 119(e), to U.S. Provisional Patent Application Ser. No. 61/073,183, filed on Jun. 17, 2008, which is incorporated herein by reference in its entirety.

TECHNICAL FIELD

Embodiments described herein relate generally to semiconductor circuits which include multi-gate field effect transistor devices.

BACKGROUND

Semiconductor devices such as multi-gate field effect transistors are often designed for applications using circuits with down-scaled, extremely small devices. Semiconductor devices used for analog and RF applications may require different device characteristics compared to those used in digital applications. Harmonic distortion of signals in amplifier circuits increases with signal amplitude and limits the dynamic range of these circuits. Flicker noise (also referred to as 1/f noise) may depend on properties of fin surfaces in multi-gate field effect transistors and limits resolution in analog and RF circuits. Gate resistance limits gain and increases noise in RF circuits. While the optimization of the ON/OFF currents for digital circuits is the main target during process development, an improvement of analog transistor characteristics without process changes is desirable for mixed signal and RF circuits.

DETAILED DESCRIPTION

Figure 1A:
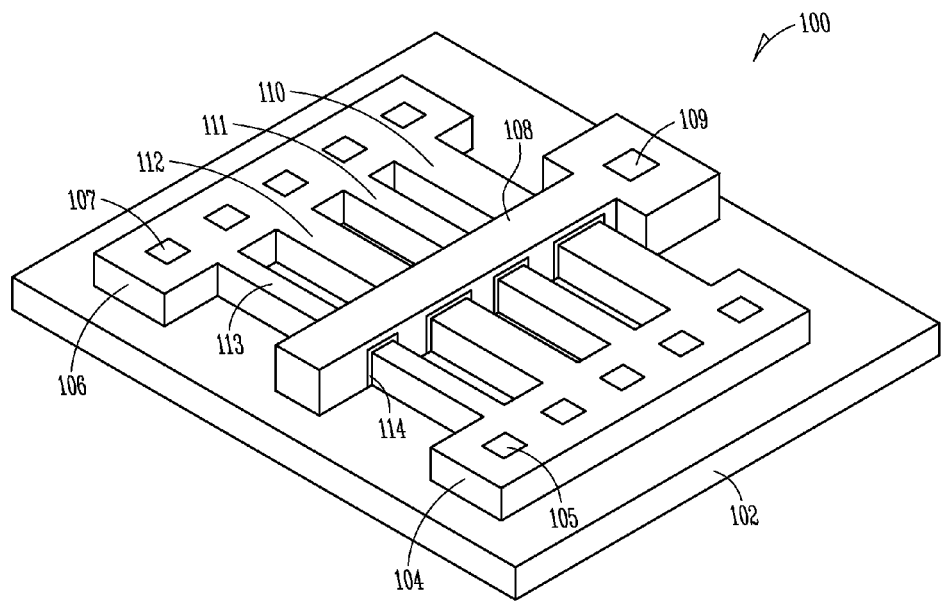
FIG. 1A illustrates a perspective view of a semiconductor device having different fin widths, according to some embodiments of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. In this document, the terms "a" or "an" are used, as is common in patent documents, to include one or more than one. In this document, the term "or" is used to refer to nonexclusive or, such that "A or B" includes "A but not B," "B but not A," and "A and B," unless otherwise indicated.

The term "substrate" is understood to include a semiconductor wafer. The term "substrate" is also used to refer to semiconductor structures during processing and may include other layers that have been fabricated thereupon. Both "wafer" and "substrate" includes doped and undoped semiconductors, epitaxial or non epitaxial semiconductor layers supported by a base semiconductor or insulator, as well as other semiconductor structures well known to one skilled in the art.

The term "multiple gate field effect transistor" (MuGFET) is used interchangeably with FinFET herein for the general class of semiconductor devices having non-planar field effect transistors formed on fins of semiconductor material having two, three, five or more planes for conducting channels.

The term "conductor" is understood to generally include n-type and p-type semiconductors and the term "insulator" or "dielectric" is defined to include any material that is less electrically conductive than the materials referred to as "conductors." The invention described here is generally related to MuGFET or FinFET transistors. The following detailed description is, therefore, not to be taken in a limiting sense.

The harmonic distortion of signals in amplifier circuits increases with signal amplitude and therefore limits the dynamic range of such circuits. A significant portion of distortion is due to the third harmonics. This is due to the fact that the frequencies in range of third harmonics are in the vicinity of the signal frequencies and consequently cannot be suppressed by filtering. Such third harmonics are generated by the third order derivative of the transistor transfer characteristics of drain current Id with respect to gate voltage Vg, namely:

$$g3=\partial^3 Id/\partial Vg^3$$

One of the design parameter that can be controlled by varying the layout of a semiconductor device is the width of the silicon fin. Changing the fin width can result in the change in threshold voltage which occurs due to quantum confinement and electrostatic effects. Changing the width of fins can also change the effective mobility and flicker noise of a FinFET device because of different surface roughness of top and side wall surfaces of a fin and due to different crystal orientations in top and sidewall surfaces of the fin. This is because mobility and flicker noise depends on surface roughness and surface orientation. In some embodiments, semiconductor devices described herein includes embodiments having fins with different crystal surface orientations in different planes of the fin. The embodiments described herein use the fin width dependent threshold voltage (Vt), mobility and flicker noise by combining multiple fins with different width in one transistor structure or a transistor structure consisting of a group of individual transistors connected by metal wiring to improve the electrical characteristics. This combination of different fin width can be done in two ways, to optimize different transistor characteristics. First, it is possible to use different fin width in a parallel configuration, to generate a transistor with modulated threshold voltages and so a broadened threshold voltage range. This results in a reduced harmonic distortion, as nonlinearities of the transistor transfer curves are smoothed by a piecewise linearization of the transistor characteristic with each fin having a different threshold voltage. Second, it is possible to use different fin width in a series configuration along the length of the fin (means channel length of the transistor) to improve electrical characteristics, like drain/source series resistance, transconductance (gm), output conductance (gds), voltage gain (=gm/gds), drain capacitance or flicker noise.

A transistor structure combining different fin widths in parallel may be used also as a tuneable capacitance (for example, a varactor) when drain and source pads are connected together to one electrical tune port. In this case the broadened threshold voltage due to different fin widths broadens the transition from a low capacitance to a high capacitance, which means the derivative of capacitance versus gate to tune port voltage decreases and so the tuning sensitivity in a voltage controlled oscillator (VCO) gets smaller and more linearized which reduces up conversion of flicker noise into VCO phase noise. Device structures described herein that combine different fins in parallel may be used as transistors or varactors (unless stated otherwise). Varactors may be formed from transistors by connecting drain and source of the transistor together.

Fin width variations in an integrated circuit may be introduced in different ways. For example, fin width variation may be introduced intentionally using a controlled process. This may be done, for example, by layout drawing or placement in different locations of the layout of the integrated circuit having different printing resolution or a dedicated processing generating large local fin width mismatch variations leading to different fin widths. In an embodiment, the widths of two fins may differ by more than 4 nm (nano meter). In an embodiment, the widths two fins may differ by more than 5 nm. In another embodiment, the widths of two fins may differ by more than 6 nm. In an embodiment, the widths of two fins may differ by more than 7 nm. In an embodiment, the widths of two fins may differ by more than 5 nm. In an embodiment, the widths of two fins may differ by more than 9 nm. In an embodiment, the widths of two fins may differ by more than 10 nm.

Additionally, in some embodiments, it is also possible to change the fin width in a step like fashion along the fin length. Changing the fin width in a series configuration along the channel length in a step like fashion can result in an improved output conductance and an improved voltage gain (gm/gds), if the fin width resulting in a lower threshold voltage (Vt) (which can be different for N-type and P-type devices, for example NMOS and PMOS transistors) is located at the drain side of the device (self-cascoding effect). In some embodiments, placing the narrow fin section at the drain and the wider fin at the source, results in a device having a lower source resistance improving the transconductance. Additionally, such a device can have a reduced drain induced barrier lowering effect and reduced short channel effect compared to a wide fin only device that improves the output conductance. An increased drain resistance due to the narrower fin on the drain side is acceptable due to its small effect on transconductance.

Figure 3A:
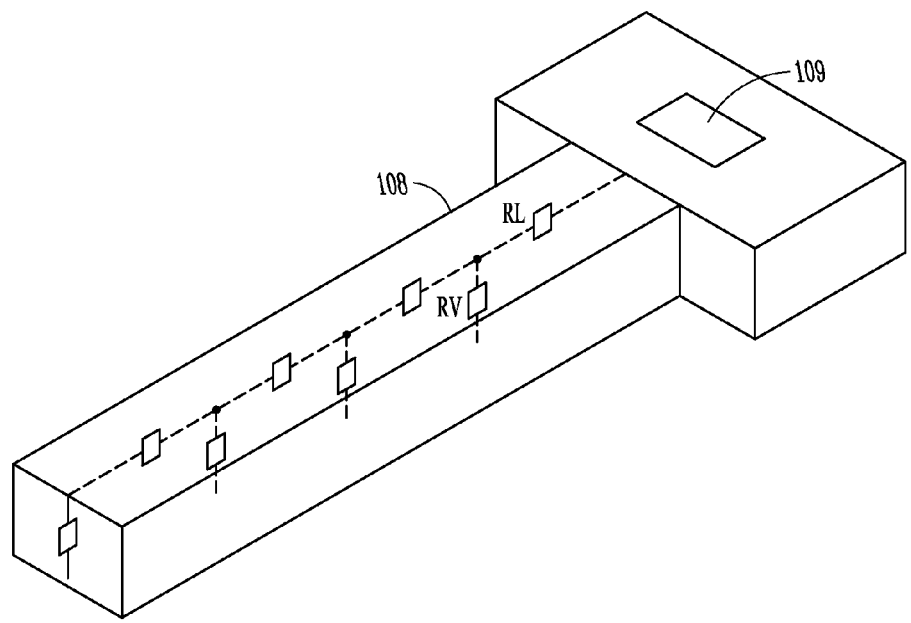
FIG. 3A illustrates a perspective view of a gate finger showing lumped resistance elements representing the distributed nature of the gate resistance when operated at RF frequencies.
Figure 3B:
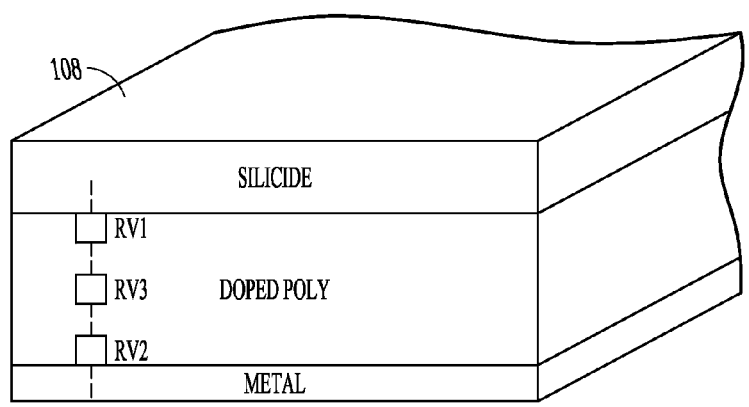
FIG. 3B illustrates a perspective view of a cross section through the gate finger of FIG. 3A showing a gate material stack.

In high frequency circuits the gate resistance plays an important role besides the already mentioned analog performance figures of merit. FIG. 3A presents the distributed gate resistance in a gate finger. This gate finger usually consists of a material stack. The stack can consist of two, three or more different materials. A conventional two material stack is poly silicon on top of the gate dielectric of the MOS device captured by an above silicide layer. In high-k metal gate devices the gate material stack consists in some embodiments of a metal on top of the gate dielectric followed by poly silicon which is caped by a silicide layer as shown in FIG. 3B. Between silicon and metal occurs an Schottky contact resistance that together with the conductivities of the materials of the stack establishes a vertical gate resistance RV shown in FIG. 3A. Compared to this vertical gate resistance there exists also a lateral gate resistance RL (also shown in FIG. 3A) that originates from the resistances of the silicide capping layer in FIG. 3B which is connected by a gate contact. Due to the high frequencies the resistance of the gate finger needs to be represented by a distributed gate resistance network as shown in FIG. 3A FIG. 1A illustrates a perspective view of a semiconductor device 100, according to some embodiments of the invention. Semiconductor device 100 includes a MuGFET with multiple narrow fins having different widths connected in parallel between a source region and a drain region, a gate dielectric and multiple gates (top and sides of the fin) to improve the gate control compared to planar devices. Semiconductor device 100 includes a substrate 102 that supports source/drain regions 104, 106, multiple fins 110, 111, 112, 113, a gate dielectric layer 114, and a gate 108. Gate dielectric layer 114 is disposed over multiple fins 110, 111, 112, and 113. In some embodiments, fins 110-113 have different fin widths. In some embodiments, the spacing S (see e.g. FIG. 3C through FIG. 3H) between adjacent fins (such as 110-111, 111-112 and 112-113) are different to find a trade off for the vertical and lateral part of the gate resistance. Especially to compensate the lower gm due to an increased source resistance in fins having smaller fin width with a reduced gate resistance for constant overall gain the fin spacing should be arranged that way that the fin spacing is increased towards smaller fin width. Source/drain regions 104, 106 includes source/drain contacts 105, 107, respectively. Gate 108 is disposed over the gate dielectric layer 114 and includes a gate contact 109.

Figure 1B:
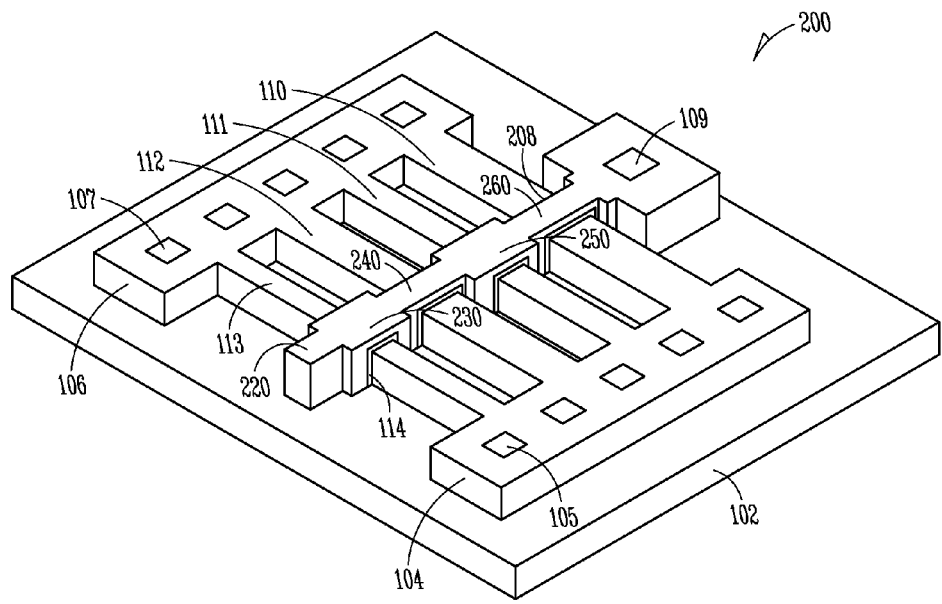
FIG. 1B illustrates a perspective view of a semiconductor device having a different fin widths and gate dimensions, according to some embodiments of the invention.

FIG. 1B illustrates a perspective view of a semiconductor device 200 having different fin widths and gate dimensions, according to some embodiments of the invention. Semiconductor device 200 includes a substrate 102 that supports source/drain regions 104, 106, fins 110-113 and gate 108. Additionally, semiconductor device 200 includes a gate dielectric 114 disposed on the top and the sides of fins 110-113. Gate dielectric 114 lies between a gate 108 and the fins 110-113. Having the gate to wrap around three sides of each of the fins provides for improved gate control when compared to planar devices. In some embodiments, source/drain regions 104, 106 includes source/drain contacts 105, 107, respectively. In some embodiments, gate 108 includes a gate contact 109. In some embodiments, gate 108 includes gate segments 220, 230, 240, 250 and 260. In some embodiments, gate segments 220, 230, 240, 250 and 260 have different gate lengths (=channel lengths). In some embodiments, the fins 110-113 have different fin widths. In particular there are two possible ways of arrangement. One can combine a small fin width with a short channel length and a large fin width with a long channel length. This option suppresses short channel effects that influence the subthreshold slope. Another combination is to combine a small fin width with a long channel length and a larger fin width with a short channel length. This option allows for larger threshold voltage variations from fin to fin. In some embodiments, the spacing between adjacent fins (such as 110-111, 111-112 and 112-113) is changing. In some embodiments, the configuration such as that shown in FIG. 1A and FIG. 1B provides for multiple threshold voltage (Vt) values that can result in the smoothening of transistor or varactor nonlinearities. Consequently, such an arrangement can be used for improved distortion behaviour of a transistor or capacitance tuning behaviour of a varactor.

Figure 2A:
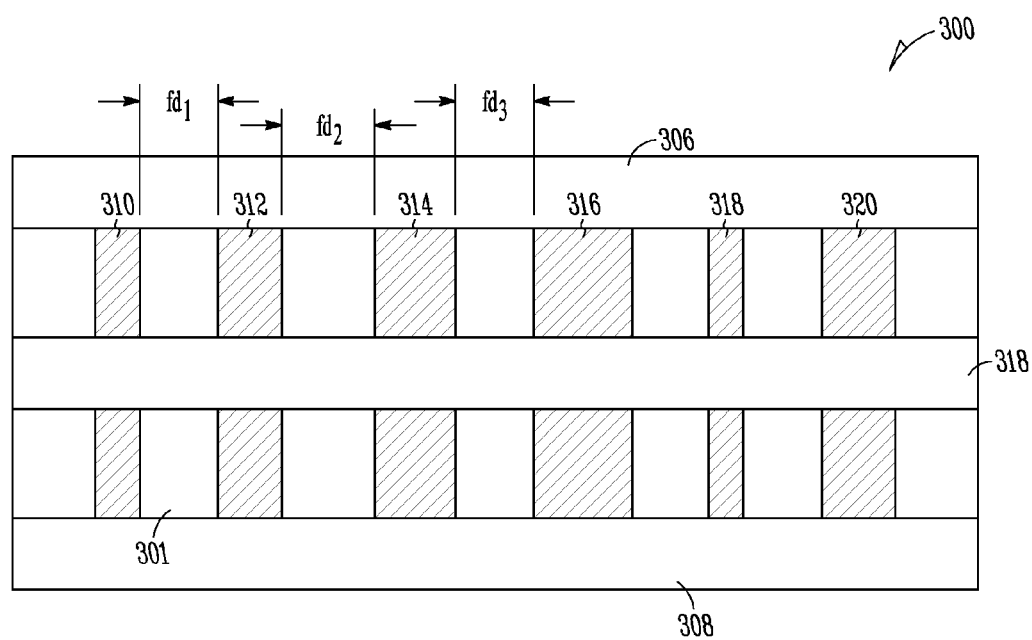
FIG. 2A illustrates a top view of a semiconductor device having different fin widths, according to some embodiments of the invention.

FIG. 2A illustrates a top view of a semiconductor device having fins 310, 312, 314, 316, 318 and 320 with different fin widths connected in parallel to drain pads 306 and source pads 308, according to some embodiments of the invention.

Figure 2B:
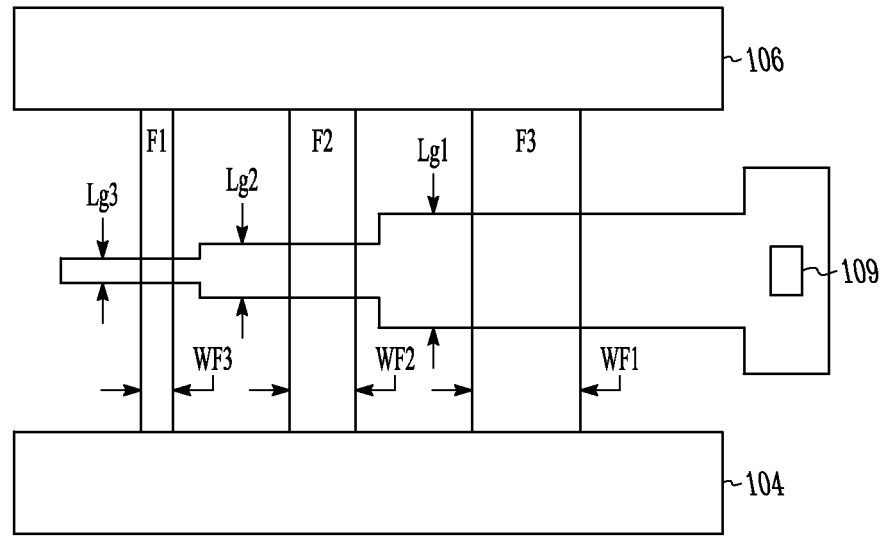
FIG. 2B illustrates a top view of a semiconductor device having different fin widths and gate dimensions, according to some embodiments of the invention.

FIG. 2B illustrates a top view of a semiconductor device having different fin widths and gate dimensions, according to some embodiments of the invention. In FIG. 2B a FinFET device having different fin widths WF1, WF2 and WF3 is combined with different gate lengths Lg1, Lg2 and Lg3. The larger fin width WF is combined with the larger gate length Lg. This supports a tradeoff in the short channel effect with small gate length and larger fin width. The largest gate length Lg1 is placed most near to the gate contact 109 and the smallest gate length Lg3 is placed most far away from the gate contact 109. Such an arrangement combines higher gm through smaller gate lengths with a higher gate resistance leading to the same gain at RF frequencies for all parts of the device having different fin width and being connected together.

Figure 2C:
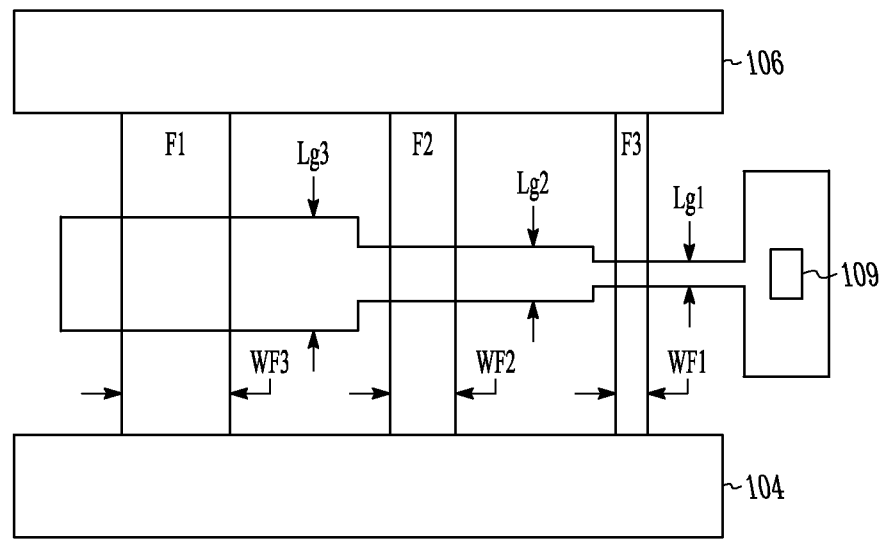
FIG. 2C illustrates a top view of a semiconductor device having different fin widths and gate dimensions, according to some embodiments of the invention.

FIG. 2C illustrates a top view of a semiconductor device having different fin widths and gate dimensions, according to some embodiments of the invention. In FIG. 2C a FinFET device having different fin widths WF1, WF2 and WF3 is combined with different gate lengths Lg1, Lg2 and Lg3. The larger fin width WF is combined with the larger gate length Lg. This supports a tradeoff in the short channel effect with small gate length and larger fin width. The largest gate length Lg3 is placed most far from the gate contact 109 and the smallest gate length Lg1 is placed most near to the gate contact 109. Such an arrangement could lead to the same gain at RF frequencies for all parts of the device having different fin width WF depending on the values for the lateral (RL) and vertical (RV) part of the gate resistance.

Figure 2D:
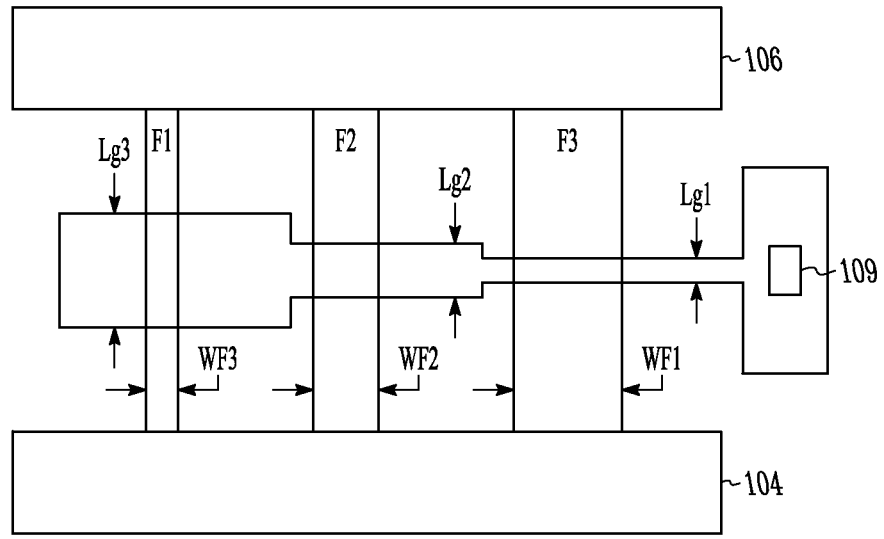
FIG. 2D illustrates a top view of a semiconductor device having different fin widths and gate dimensions, according to some embodiments of the invention.

FIG. 2D illustrates a top view of a semiconductor device having different fin widths and gate dimensions, according to some embodiments of the invention. . In FIG. 2D a FinFET device having different fin widths WF1, WF2 and WF3 is combined with different gate lengths Lg1, Lg2 and Lg3. The larger fin width WF is combined with the smaller gate length Lg. This arrangement combines the lower drain/source resistance of larger fin width WF with the higher transconductance gm of shorter gate length Lg and lower parasitic gate to drain/source pad capacitance of shorter gate length Lg. The largest gate length Lg3 is placed most far from the gate contact 109 and the smallest gate length Lg1 is placed most near to the gate contact 109. Such an arrangement could lead to the same gain at RF frequencies for all parts of the device having different fin width WF depending on the values for the lateral (RL) and vertical (RV) part of the gate resistance.

Figure 2E:
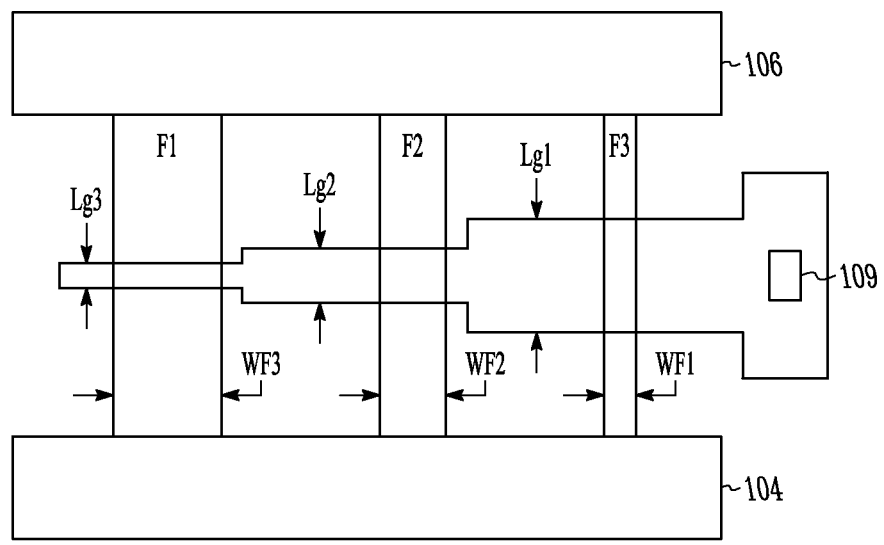
FIG. 2E illustrates a top view of a semiconductor device having different fin widths and gate dimensions, according to some embodiments of the invention.

FIG. 2E illustrates a top view of a semiconductor device having different fin widths and gate dimensions, according to some embodiments of the invention. In FIG. 2E a FinFET device having different fin widths WF1, WF2 and WF3 is combined with different gate lengths Lg1, Lg2 and Lg3. The larger fin width WF is combined with the smaller gate length Lg. This arrangement combines the lower drain/source resistance of larger fin width WF with the higher transconductance gm of shorter gate length Lg and lower parasitic gate to drain/source pad capacitance of shorter gate length Lg. The smallest gate length Lg3 is placed most far from the gate contact 109 and the largest gate length Lg1 is placed most near to the gate contact 109. Such an arrangement could lead to the same gain at RF frequencies for all parts of the device having different fin width WF depending on the values for the lateral (RL) and vertical (RV) part of the gate resistance.

Figure 3C:
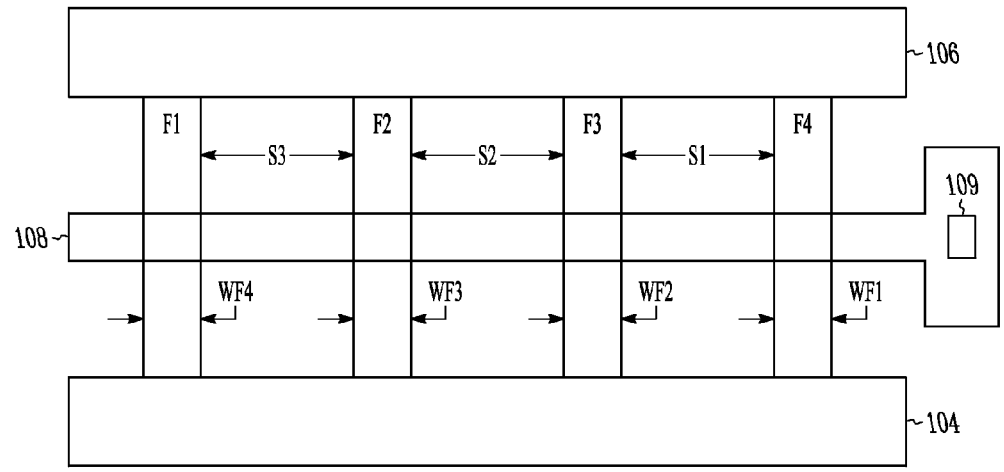
FIG. 3C illustrates a top view of a semiconductor device having different fin spacing, according to some embodiments of the invention.
Figure 3D:
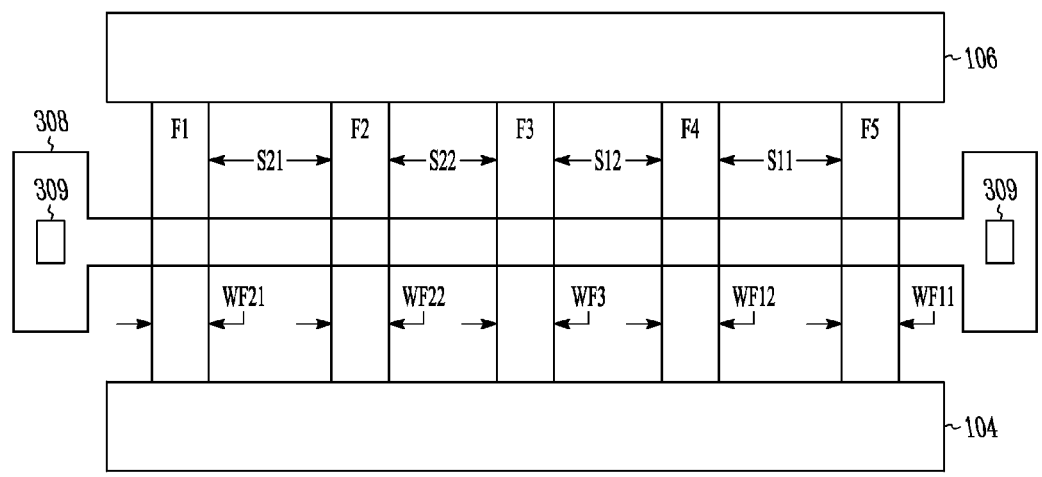
FIG. 3D illustrates a top view of a semiconductor device having different fin spacing and gate contacts on two ends, according to some embodiments of the invention.
Figure 3E:
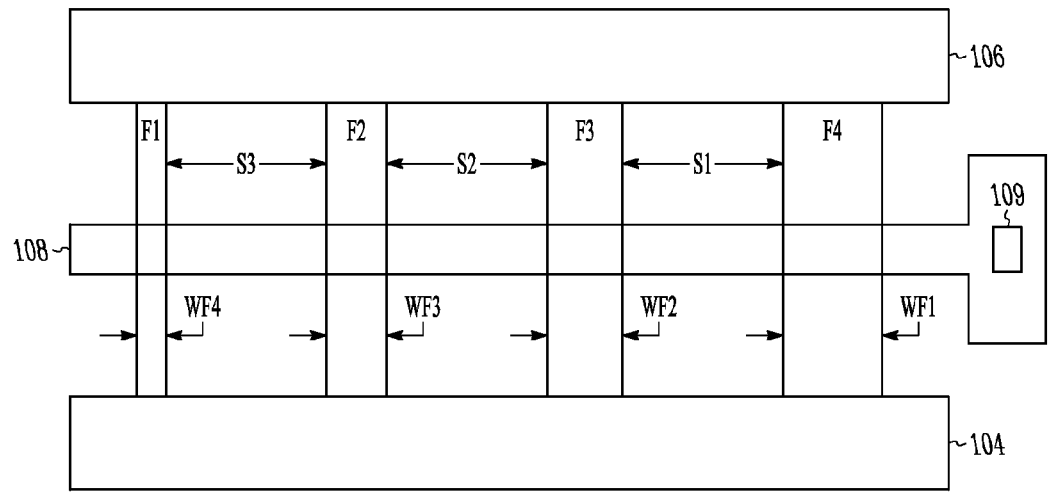
FIG. 3E illustrates a top view of a semiconductor device having decreasing fin widths away from the gate contact, according to some embodiments of the invention.
Figure 3F:
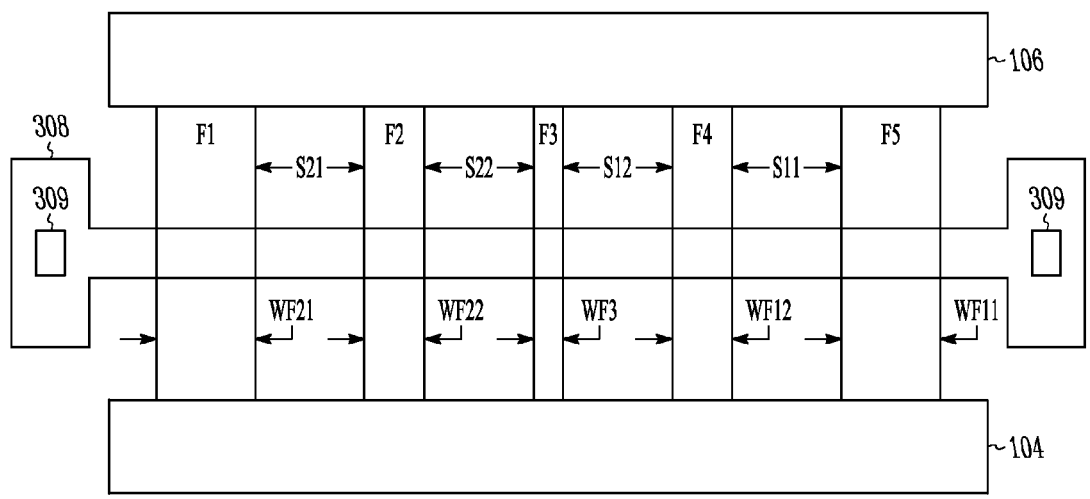
FIG. 3F illustrates a top view of a semiconductor device having gate contacts at opposite ends of the device and fin widths decreasing towards the center of the device, according to some embodiments of the invention.

All the devices in FIG. 1A through FIG. 2E can be arranged in a symmetric way with two gate contacts on opposite sides in the same manner as converting the device of FIG. 3E into the device of FIG. 3F.

FIG. 3A illustrates a perspective view of a gate finger showing lumped resistance elements modeling the gate resistance. When operating the gate finger at high frequencies the resistance of the gate finger needs to be represented by a distributed gate resistance network shown in FIG. 3A consisting of lumped resistances lateral along the gate finger (RL) and vertical (RV) from top to bottom of the gate finger.

FIG. 3B illustrates a perspective view of a cross section through material stack of the gate finger of FIG. 3A, according to some embodiments of the invention. The gate finger usually consists of a material stack. The stack can consist of two, three or more different materials. A conventional two material stack is poly silicon on top of the gate dielectric of the MOS device captured by an above silicide layer. In high-k metal gate devices the gate material stack consists in some embodiments of a metal on top of the gate dielectric followed by poly silicon which is caped by a silicide layer as shown in FIG. 3B. Between silicon and metal occurs an Schottky contact resistance that together with the conductivities of the materials of the stack establishes a specific vertical gate resistance rv (with the unit of a resistance per area) leading to the vertical resistance RV shown in FIG. 3A. Compared to this specific vertical gate resistance RV there exists also a specific lateral gate resistance rl (with the unit of a resistance per length) leading to the lateral resistance RL shown in FIG. 3A that originates from the resistances of the silicide caping layer in FIG. 3B which is connected by a gate contact.

FIG. 3C illustrates a top view of a semiconductor device, according to some embodiments of the invention. In some embodiments, the device shown in FIG. 3C includes a portion of device 100 shown in FIG. 1. In some embodiments, the device shown in FIG. 3C includes fins F1, F2, F3 and F4 having fin widths WF1, WF2, WF3, and WF4, respectively. Additionally, fin spacing S1 is the distance between fins F1 and F2; fin spacing S2 is the distance between fins F2 and F3; fin spacing S3 is the distance between F3 and F4. Gate 108 is disposed over a gate dielectric layer provided over the fins. The absolute value of the lateral gate resistance for one fin F of the FinFET device is proportional to the distance of the fin from the gate contact. The absolute value of the vertical resistance RV for one fin is dependent on the area defined by the gate length Lg and the spacing S of the fin to other fins. As mentioned above by varying the fin widths of fins F1, F2, F3 and F4 the electrical characteristics of the transistor structure can be altered. In some embodiments, the fin widths WF1, WF2, WF3 and WF4 are of equal widths. In some embodiments, the semiconductor device shown in FIG. 3C includes at least two of the fins having different fin widths. In some embodiments, the fin spacing in the device is such that the fin spacing increases with distance from the gate contact (=S1<S2<S3) depending on the values of the specific lateral (rv) and vertical (rl) resistance. In some embodiments, the fin spacing in the device is decreases with the distance from the gate contact (=S1>S2>S3) depending on the values of the specific lateral rl and vertical rv resistance.

FIG. 3D illustrates a top view of a semiconductor device having gate contacts on two ends, according to some embodiments of the invention. In some embodiments, the device shown in FIG. 3D includes a gate 308 disposed over a gate layer provided over the fins. In some embodiments, gate 308 has gate contacts 309 on either ends of gate 308. In some embodiments, device shown in FIG. 3D includes fins F1, F2, F3, F4 and F5 having fin widths WF21, WF22, WF3, WF12 and WF11, respectively. In some embodiments, fin widths WF11=WF12=WF21=WF22=WF3. In some embodiments, fin spacing S11 and S21 are equal and less than fin spacing S12 and S22, where S12=S22 depending on the values of the specific lateral (rv) and vertical (rl) resistance. In some embodiments, fin spacing S11 and S21 are equal and larger than fin spacing S12 and S22, where S12=S22 depending on the values of the specific lateral (rv) and vertical (rl) resistance.

FIG. 3E illustrates a top view of a semiconductor device having decreasing fin widths away from the gate contact, according to some embodiments of the invention. In some embodiments of the semiconductor device shown in FIG. 3E, the fin width decreases (=WF1>WF2>WF3>WF4) and the fin spacing increases with distance from that gate contact (=S1<S2<S3) depending on the values of the specific lateral (rv) and vertical (rl) resistance. In some embodiments of the semiconductor device shown in FIG. 3E, the fin width decreases (=WF1>WF2>WF3>WF4) and the fin spacing decreases (=S1>S2>S3) with distance from the gate contact depending on the values of the specific (rv) and vertical (rl) resistance.

FIG. 3F illustrates a top view of a semiconductor device having gate contacts at opposite ends of the device and fin widths decreasing towards the center of the device, according to some embodiments of the invention. In some embodiments of the semiconductor device shown in FIG. 3F, fin width WF11=WF21>WF12=WF22>WF3 and fin spacing S11=S21 and less than S22=S12. In some embodiments of the semiconductor device shown in FIG. 3F, fin width WF11=WF21>WF12=WF22>WF3 and fin spacing S11=S21 and may be larger than S22=S12.

Figure 3G:
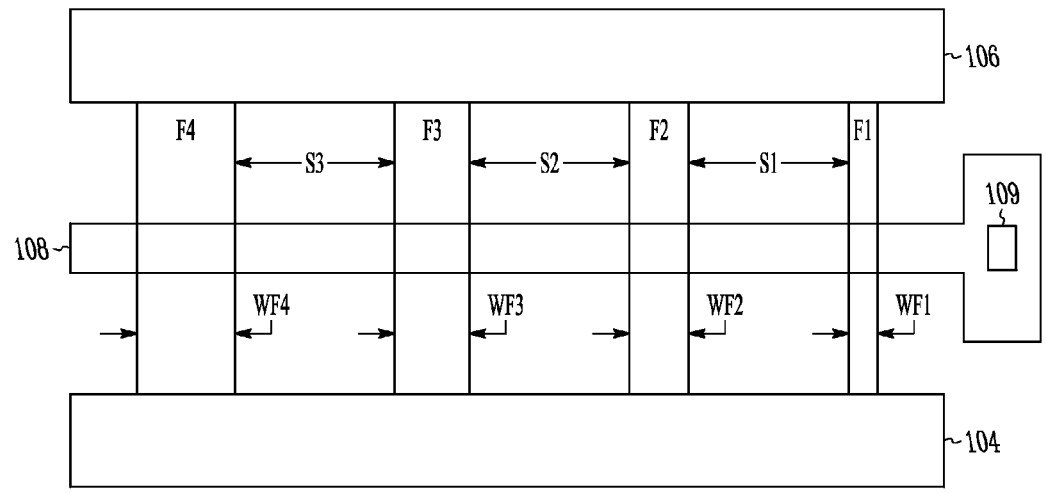
FIG. 3G illustrates a top view of a semiconductor device having increasing fin widths away from the gate contact, according to some embodiments of the invention.

FIG. 3G illustrates a top view of a semiconductor device having increasing fin widths away from the gate contact, according to some embodiments of the invention. In some embodiments of the semiconductor device shown in FIG. 3G, the fin widths increases (=WF1<WF2<WF3<WF4) and the fin spacing increases (=S1<S2<S3) with increasing distance from the gate contact depending on the values of the specific lateral (rv) and vertical (rl) resistance. In some embodiments of the semiconductor device shown in FIG. 3G, the fin widths increases (=WF1<WF2<WF3<WF4) and the fin spacing decreases (=S1>S2>S3) with increasing distance from the gate contact depending on the values of the specific lateral (rv) and vertical (rl) resistance.

Figure 3H:
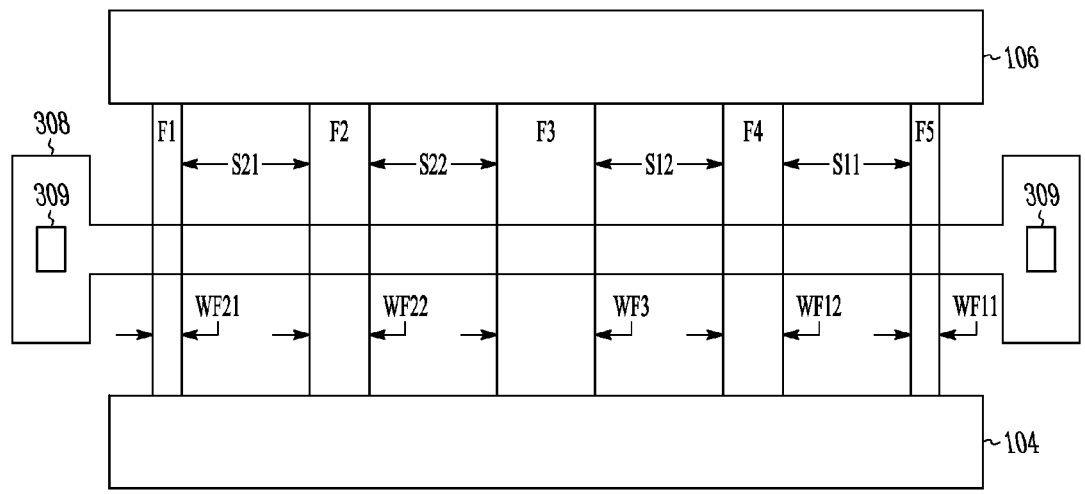
FIG. 3H illustrates a top view of a semiconductor device having gate contacts at opposite ends of the device and fin widths increasing towards the center of the device, according to some embodiments of the invention.

FIG. 3H illustrates a top view of a semiconductor device having gate contacts at opposite ends of the device and fin widths increasing towards the center of the device, according to some embodiments of the invention. In some embodiments of the semiconductor device shown in FIG. 3H, fin width WF11=WF21<WF12=WF22<WF3 and fin spacing S11=S21<S12=S22 depending on the values of the specific lateral (rv) and vertical (rl) resistance. In some embodiments of the semiconductor device shown in FIG. 3H, fin width WF11=WF21<WF12=WF22<WF3 and fin spacing S11=S21>S12=S22 depending on the values of the specific lateral (rv) and vertical (rl) resistance.

In some embodiments the devices shown in FIG. 3C, FIG. 3D, FIG. 3E, FIG. 3F, FIG. 3G and FIG. 3H combining different fin spacing with different fin width can additionally combine different fin width WF with different gate length Lg. Possible combinations of fin width WF with gate length Lg can be found in FIG. 2B, FIG. 2C, FIG. 2D and FIG. 2E but are not limited to this combinations.

Fin space variations in an integrated circuit may be introduced in different ways. For example, fin space variation may be introduced intentionally using a controlled process. This may be done, for example, by layout drawing or placement in different locations of the layout of the integrated circuit having different printing resolution or a dedicated processing generating large local fin width mismatch variations leading to different fin spacings. In an embodiment, the spacing between two fins may differ by more than 4 nm (nano meter). In an embodiment, the spacing between two fins may differ by more than 5 nm. In another embodiment, the spacing between two fins may differ by more than 6 nm. In an embodiment, the spacing between two fins may differ by more than 7 nm. In an embodiment, the spacing between two fins may differ by more than 5 nm. In an embodiment, the spacing between two fins may differ by more than 9 nm. In an embodiment, the spacing between two fins may differ by more than 10 nm.

Figure 4:
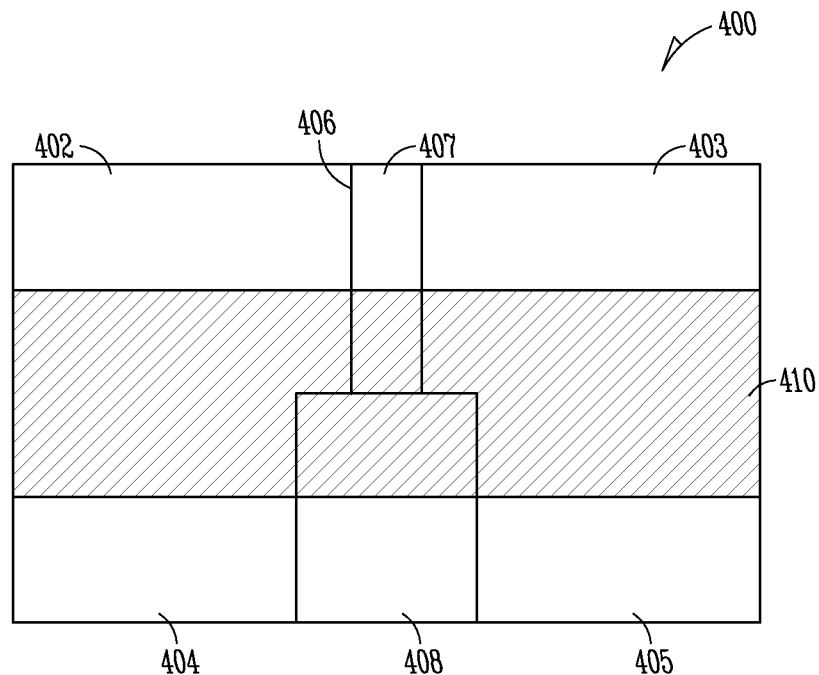
FIG. 4 illustrates a top view of a semiconductor device having a stepped fin-width structure, according to some embodiments of the invention.

FIG. 4 illustrates a top view of a semiconductor device 400 having a stepped fin-width structure, according to some embodiments of the invention. In some embodiments, device 400 is included as a portion of device 100 shown in FIG. 1A. In some embodiments, device 400 includes a substrate region 402-405 that supports a fin structure 406. In some embodiments, fin structure 406 includes a first segment 407 and a second segment 408. In some embodiments, the width of the first segment 408 is larger than the width of the second segment 407. In some embodiments, one end of first segment 407 is coupled to a source region (not shown in FIG. 4) and one end of the second segment 408 is coupled to the drain region (not shown in FIG. 4) and the remaining ends of first and second segments 407, 408 are coupled to each other. In some embodiments, one end of first segment 407 is coupled to a drain region and one end of the second segment 408 is coupled to the source region and the remaining ends of first and second segments 407, 408 are coupled to each other. In some embodiments gate 410 is disposed over a dielectric layer overlaying on top of fin structure 406. As shown in FIG. 4, the two different fin widths (for fin segments 407 and 408) can be used to generate two channel regions with different threshold voltages, drain and source resistances and flicker noise because flicker noise of drain current depends on noise contributions along the channel length and possibly additionally also on mobility if fins with different crystal orientation in top and sidewall surface are used. These features can be used to provide improved output conductance, transconductance and improved signal to noise ratio.

The multiple fin width devices described above connecting fin segments with different fin widths in series can be combined with a split gate structure combining different gate length with different fin width. Some embodiments combine a short gate length (channel length) on a wider fin connected to the source while having the longer gate length (channel length) running over the narrower fin on the drain side providing lower source resistance and higher gm compared to a narrow fin only device and lower output conductance compared to a wide fin only device. Other embodiments combine a long gate length over the wider fin as a first part and a short gate length over the narrower fin as a second part of the split gate structure. Some embodiments connect the first part to the source and second part to the drain. Some embodiments connect the first part to the drain and second part to the source. The use of a special combination of fin width and gate length (=channel length) depends on whether the threshold voltage increases with a wider fin due to body depletion charge or a narrower fin due to short channel effects (affecting e.g. the subthreshold slope) and the increase of threshold voltage with shorter gate length due to halos or the decrease of the threshold voltage with shorter gate length due to short channel effects.

Figure 13:
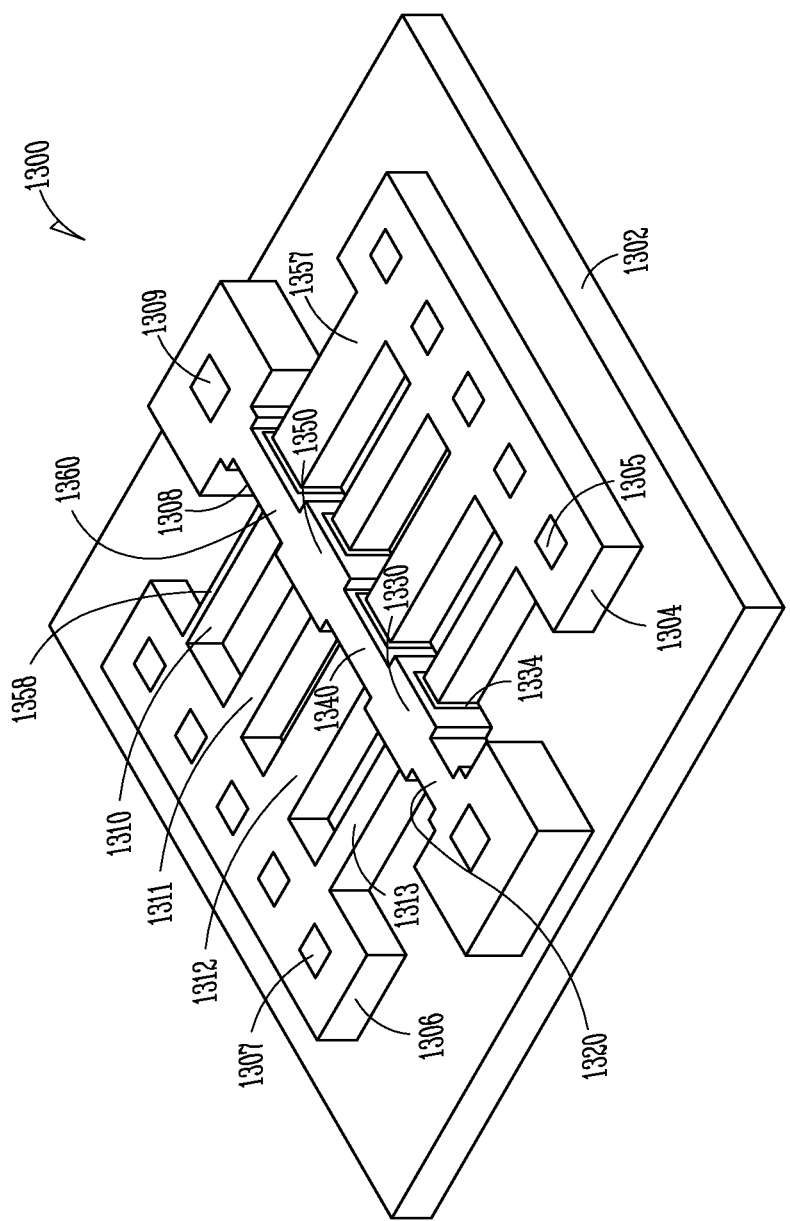
FIG. 13 illustrates generally an example semiconductor device.

FIG. 13 illustrates generally an example semiconductor device 1300. Semiconductor device 1300 can include a MuG-FET with multiple fins having different widths connected in parallel between a source region and a drain region, a gate dielectric and multiple gates (top and sides of the fin) to improve the gate control compared to planar devices. Semiconductor device 1300 can include a substrate 1302 that supports source/drain regions 1304, 1306, multiple fins 1310, 1311, 1312, 1313, a gate dielectric layer 1314, and a gate 1308. Gate dielectric layer 1314 can be disposed over multiple fins 1310, 1311, 13312, and 113. In some embodiments, fins 1310-1313 have different fin widths. In some embodiments, the spacing S (see e.g. FIG. 3C through FIG. 3H) between adjacent fins (such as 1310-1311, 1311-1312 and 1312-1313) are different to find a trade off for the vertical and lateral part of the gate resistance. To compensate the lower gm due to an increased source resistance in fins having smaller fin width with a reduced gate resistance for constant overall gain, the fin spacing should be arranged that way such that the fin spacing is increased towards smaller fin width. In some embodiments, gate 1308 includes gate segments 1320, 1330, 1340, 1350 and 1360. In some embodiments, gate segments 1320, 1330, 1340, 1350 and 1360 have different gate lengths (=channel lengths). In some embodiments, the fins 1310-1313 have different fin widths. Source/drain regions 1304, 1306 includes source/drain contacts 1305, 1307, respectively. Gate 1308 can be disposed over the gate dielectric layer 1314 and can include one or more gate contacts 1309. In various embodiments, a first fin 1310 can include a stepped fin-width structure. In some embodiments, the first fin 1310 can include a first segment 1357 and a second segment 1358. In some embodiments, the width of the first segment 1357 is larger than the width of the second segment 1358. In some embodiments, one end of first segment 1357 can be coupled to a first source/drain region 1304 and one end of the second segment 1358 can be coupled to a second source drain region 1306 and the remaining ends of first and second segments 1357, 1358 can be coupled to each other under a gate segment 1360.

The split gate structure can be applied also to the multiple fin width devices connecting fins with different fin width in parallel (e.g. FIG. 2A) combining the good gain gm/gds of the self-cascoding split gate structure with the good linearity of the multi fin width device.

Figure 5:
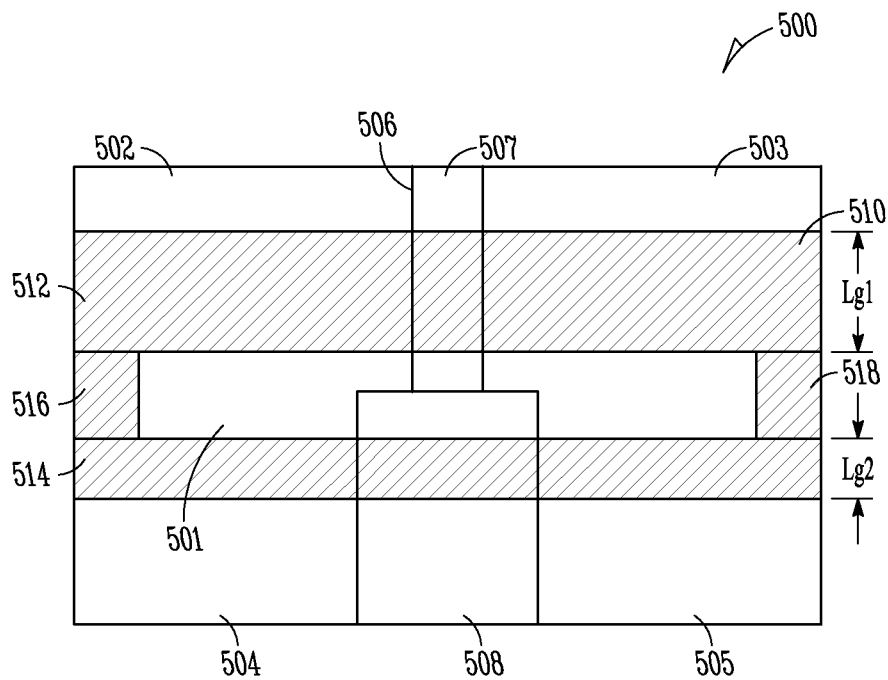
FIG. 5 illustrates a top view of a semiconductor device having a stepped fin-width structure and a split gate structure, according to some embodiments of the invention.

FIG. 5 illustrates a top view of a semiconductor device 500 having a stepped fin-width structure along with a split gate structure, according to some embodiments of the invention. In some embodiments, device 500 is included as a portion of device 100 shown in FIG. 1A. In some embodiments, device 500 includes a substrate region 501-505 that supports a fin structure 506 and a split gate 510. In some embodiments, fin structure 506 includes a first fin segment 507, and a second fin segment 508. In some embodiments, the width of the first fin segment 508 is larger than the width of the second fin segment 507. In some embodiments, split gate 510 includes a first gate segment 512 and a second gate segment 514. In some embodiments, the first gate segment 512 and the second gate segment 514 are electrically coupled at both ends using coupling gate segments 516 and 518. In some embodiments, first gate segment 512 has a gate length "Lg1" and the second gate segment has a gate length "Lg2". In some embodiments, the first gate segment 512 and second gate segment 514 are electrically coupled at one end and electrically isolated at the other end. In some embodiments, first gate segment 512 of split gate 510 is disposed on top of first fin segment 507 of fin 506. In some embodiments, second gate segment 514 of split gate 510 is disposed on top of second fin segment 508 of fin 506. In some embodiments, the first gate segment 512 has a larger gate length "Lg1" than the second gate segment 514 with a gate length "Lg2". Advantages of gate segmentation provided as shown in FIG. 5 includes avoiding the scenario of disposing of gate 510 in the active region of the transistor where the fin edges of the first segment 507 meet the fin edges of the second segment 508. The regions not covered by a gate and a spacer maybe receive a drain/source implant.

The split gate structure can be arranged asymmetrically with respect to drain and source. Some embodiments having the first part of the split gate near the source for reduced source resistance. Some embodiments having the first part of the split gate far from the source for reduced gate to source capacitance. Some embodiments having the second part of the split gate far from the drain for reduced gate to drain (miller) capacitance. The corresponding larger drain resistance in this case is acceptable due to its small effect on transconductance when the device is operated in saturation.

The device of FIG. 5 can also combine a first N-type or P-type device, for example an NMOS or PMOS transistor having the narrow fin in series with a second NMOS transistor having the wider fin or vice versa. (e.g. providing the first device as a NMOS cascode device or a PMOS current source and the other as a NMOS switching or amplifying device). In some embodiments of FIG. 5, both gates segments 512 and 514 can be connected to the same signal (e.g. used in self cascoding devices). In some embodiments of FIG. 5, both gates of the split gate can be connected to different signals (e.g. used in cascode or mixer circuits).

Figure 6A:
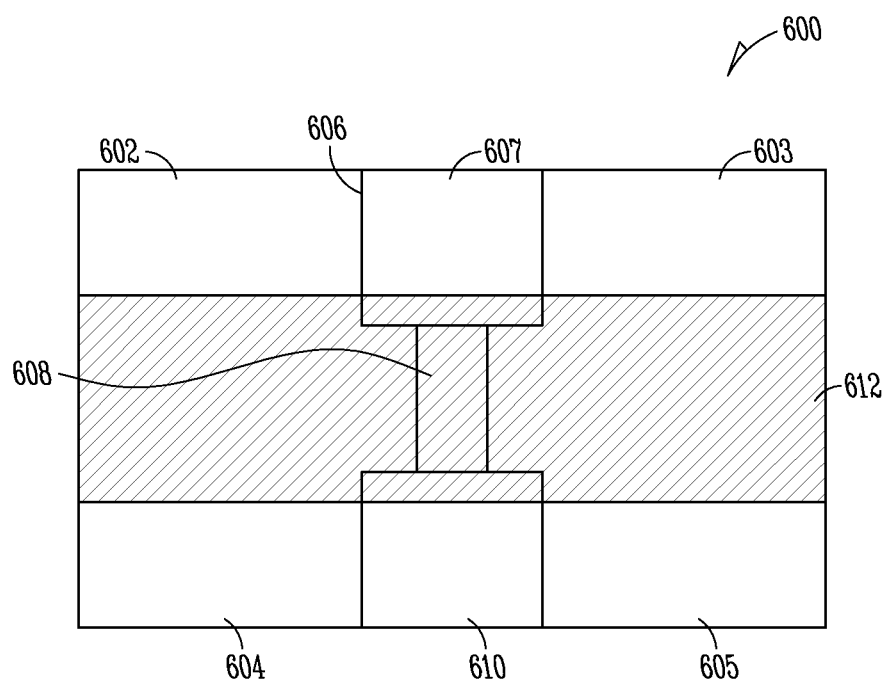
FIG. 6A illustrates a top view of a semiconductor device having a stepped fin structure with a narrow fin width in the center of the fin, according to some embodiments of the invention.

FIG. 6A illustrates a top view of a semiconductor device 600 having a stepped fin structure, according to some embodiments of the invention. In some embodiments, device 600 is included as a portion of device 100 shown in FIG. 1A. In some embodiments, device 600 includes a substrate region 602-605 that supports a fin structure 606 and a gate 612. In some embodiments, fin structure 606 includes a first fin segment 607, a second fin segment 608 and a third fin segment 610. In some embodiments, the first fin segment 607 and the third fin segment 610 have approximately the same width. In some embodiments, the second fin segment 608 has a width that is smaller than at least one of first fin segment 607 and third fin segment 610. In some embodiments, the gate 612 is disposed over a portion of fin structure 606 such that all sides of second fin segment 608 is covered with the gate material that forms gate 612. Additionally, the gate 612 is disposed over the fin structure 606 such that it lays over equal portions of the first fin segment 607 and the third fin segment 610.

In some embodiments, larger fin width of the fins can be also used to reduce the source and drain series resistance, and it is also possible to combine this resistance reduction with an asymmetric channel having modulated threshold voltage along the channel length. Because flicker noise has different contributions along channel length to the total amount of drain current noise and flicker noise depends on local threshold voltage and effective crystal orientation of top and sidewall surfaces of fin along the channel, modulation of fin width along channel length can tailor noise contributions along channel length resulting in reduced total amount of flicker noise. In some embodiments, reduced drain/source series resistance can be obtained by using wider fins in the outer regions of fin structure 606.

Figure 6B:
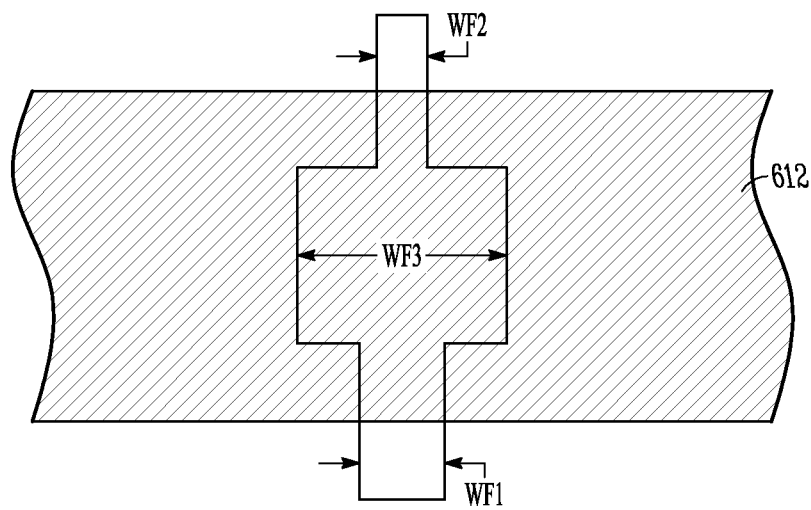
FIG. 6B illustrates a top view of a semiconductor device having a stepped fin structure with a broad fin width in the center of the fin, according to some embodiments of the invention.

FIG. 6B illustrates a top view of a semiconductor device 600 having a stepped fin structure with a broad fin width in the center of the fin, according to some embodiments of the invention. In some embodiments, device 600 is included as a portion of device 100 shown in FIG. 1A. In some embodiments of the semiconductor device shown in FIG. 6B, the fin has three sections, a first section having a width WF2, a second section having width WF3 and a third section with fin width WF1. In some embodiments, a gate structure 612 overlaps completely the second section of the fin and a portion of the first section and the third section of the fin. FIG. 6B presents somehow the inverted structure of FIG. 6A having narrow fins segments at drain (WF2) and source (WF1) and a fin section with larger fin width WF3 compared to fin segments connected to drain and source in the center of the multiple fin width device connecting different fin width in a series connection. In some embodiments, WF3>WF2 and WF3>WF1. In some embodiments, WF3>WF2 and WF3>WF1 and WF1>WF2. In some embodiments, WF3>WF2=WF1.

Figure 6C:
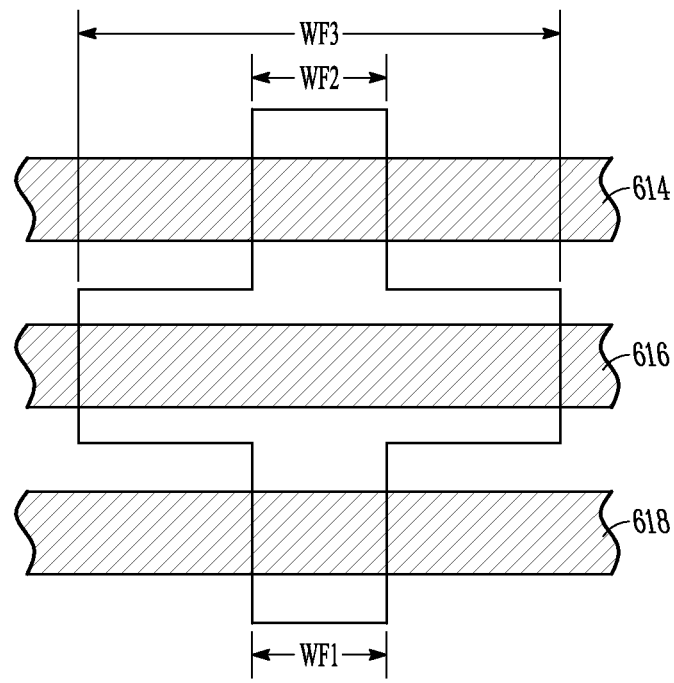
FIG. 6C illustrates a top view of a semiconductor device having a stepped fin structure having sections with different fin widths and separate gates for each of the different fin sections connected to the same gate signal or connected to different gate signals, according to some embodiments of the invention.

FIG. 6C illustrates a top view of a semiconductor device having a stepped fin structure having sections with different fin widths and separate gates for each of the different fin sections, according to some embodiments of the invention. In some embodiments, device 600 is included as a portion of device 100 shown in FIG. 1A. In some embodiments of the semiconductor device shown in FIG. 6C, the fin has three sections, a first section having a width WF2, a second section having width WF3 and a third section with fin width WF1. In some embodiments, a gate structure having section 614, 616 and 618 overlap portions of the fin such that 614 overlaps a portion of the first section, 616 overlaps the a portion of the second section and 618 overlaps a portion of the third section. In some embodiments, WF3>WF2 and WF3>WF1. In some embodiments, WF3>WF2 and WF3>WF1 and WF1>WF2. In some embodiments, WF3>WF2=WF1.

Figure 6D:
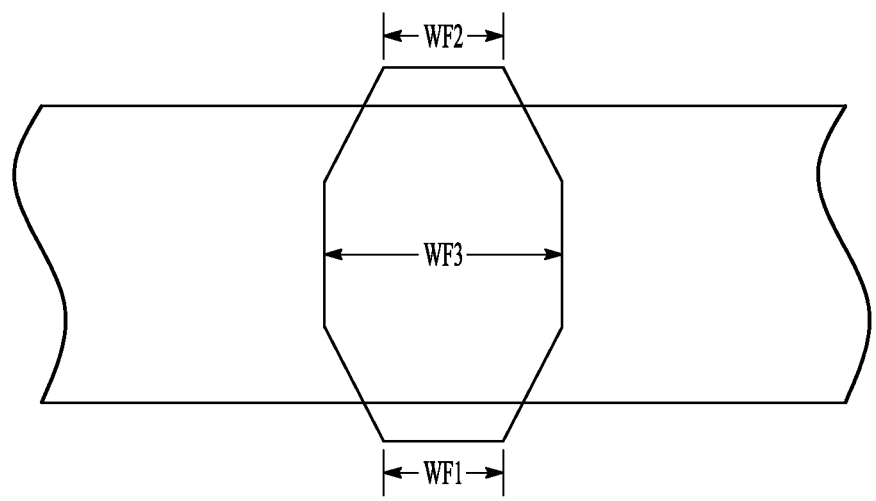
FIG. 6D illustrates a top view of a semiconductor device having a stepped fin structure with a broad fin width in the center of the fin and tapered transitions of the fin width from the center to narrower fin width at source and drain ends.

FIG. 6D illustrates a top view of a semiconductor device 600 having a stepped fin structure with a broad fin width in the center of the fin and tapered transitions from the broad central fin to the narrower outer fin parts , according to some embodiments of the invention. In some embodiments, device 600 is included as a portion of device 100 shown in FIG. 1. In some embodiments of the semiconductor device shown in FIG. 6D, the fin has three sections, a first section having a width WF2, a second section having width WF3 and a third section with fin width WF 1. In some embodiments, a gate structure 612 overlaps completely the second section of the fin and a portion of the first section and the third section of the fin. The transistion from the central broad second fin section with fin width WF3 towards the more narrower first and third outer fin sections with fin widths WF2 and WF2 is arranged in an angled or tapered way. In some embodiments, WF3>WF2 and WF3>WF1. In some embodiments, WF3>WF2 and WF3>WF1 and WF1>WF2. In some embodiments, WF3>WF2=WF1.

Figure 7:
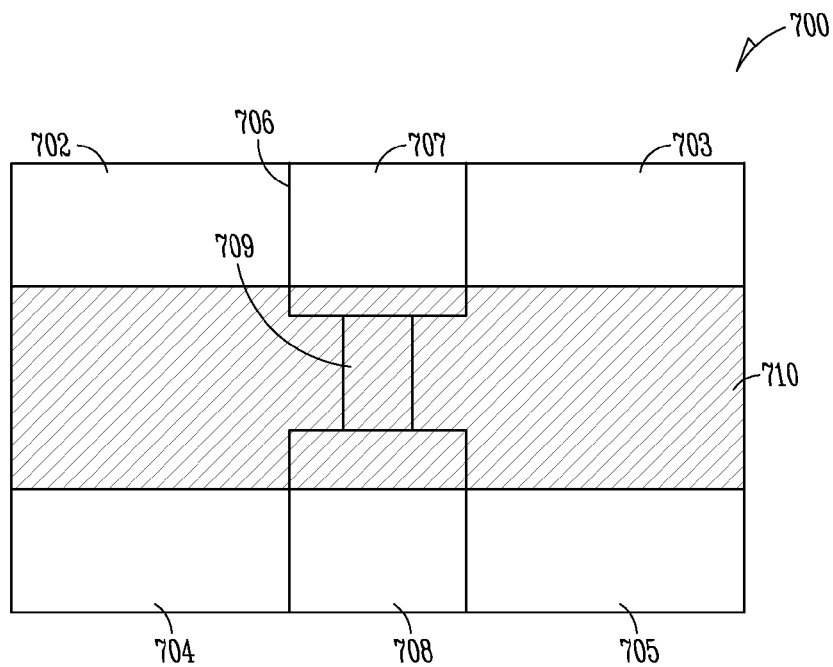
FIG. 7 illustrates the semiconductor device shown in FIG. 6A with a gate having a skewed gate arrangement disposed on the fin, according to some embodiments of the invention.

FIG. 7 illustrates the semiconductor device shown in FIG. 6A with a gate having a skewed gate arrangement disposed on the fin, according to some embodiments of the invention. In some embodiments, device 700 is included as a portion of device 100 shown in FIG. 1A. In some embodiments, device 700 includes a substrate region 702-705 that supports a fin structure 706 and a gate 710. In some embodiments, fin structure 706 includes a first fin segment 707 and a second fin segment 708 coupled by a third fin segment 709. In some embodiments, the first fin segment 707 and the second fin segment 708 have approximately the same width. In some embodiments, the third fin segment 709 has a width that is smaller than at least one of first fin segment 707 and second fin segment 708. In some embodiments, the gate 710 is disposed over a portion of fin structure 706 such that the three sides (top, left, right) of third segment 709 formed above the substrate is covered by the gate 710. Additionally, the gate 710 is disposed over fin structure 706 in such a way that the gate covers a greater portion of one of the first or second segments over the other segment. In other words the gate 710 lies over the fin structure 706 in a skewed or asymmetrical manner to create an asymmetric channel.

Referring to FIG. 4 through FIG. 7 (as well as FIG. 10), it is noted that the transition from one fin width to another fin width may be gradual as opposed to being abrupt. It is also noted that, in one or more embodiments, the fin width may change a plurality of times. Such varying fin widths may be referred to as multiple modulated fin widths.

Figure 8A:
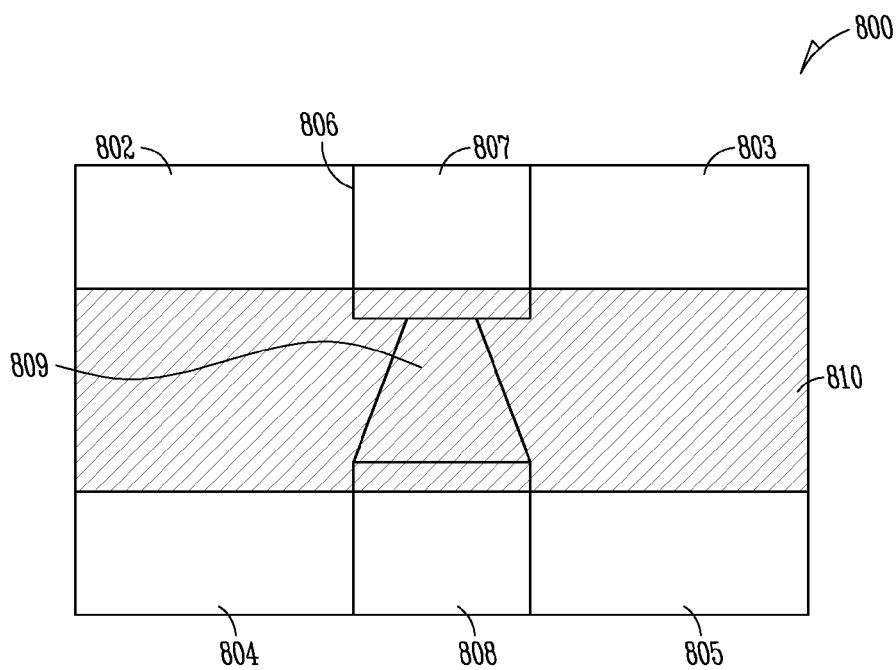
FIG. 8A illustrates a top view of a semiconductor device showing a fin structure having a tapered section, according to some embodiments of the invention.

FIG. 8A illustrates a semiconductor device 800 showing a fin structure having a tapered section, according to some embodiments of the invention. In some embodiments, device 800 is included as a portion of device 100 shown in FIG. 1A. In some embodiments, device 800 includes a substrate region 802-805 that supports a fin structure 806 and a gate 810. In some embodiments, fin structure 806 includes a first fin segment 807 and a second fin segment 808 coupled by a third fin segment 809. In some embodiments, the first fin segment 807 and the second fin segment 808 have approximately the same width. In some embodiments, the first fin segment 807 has a different width compared to the second fin segment 808. In some embodiments, the third fin segment 809 couples the first fin segment 807 and second fin segment 808 and has a structure having a width tapering between the first fin segment 807 and the second fin segment 808. In some embodiments, the gate 810 is disposed over a portion of fin structure 806 such that the three sides of third segment 809 formed above the substrate is covered by the gate 810. In some embodiments, the gate 810 is disposed over fin structure 806 in such a way that the gate covers a greater portion of one of the first (807) or second (808) segments over the other segment. In other words the gate 810 lies over the fin structure 806 in a skewed or asymmetrical manner to create an asymmetric channel. In some embodiments, the gate 810 is disposed over the fin structure 806 such that it lays over an equal portion of first fin segment 807 and a second fin segment 808. In some embodiments, providing for a graded channel width (=fin width) as shown in FIG. 8A allows for better electrical performance.

Figure 8B:
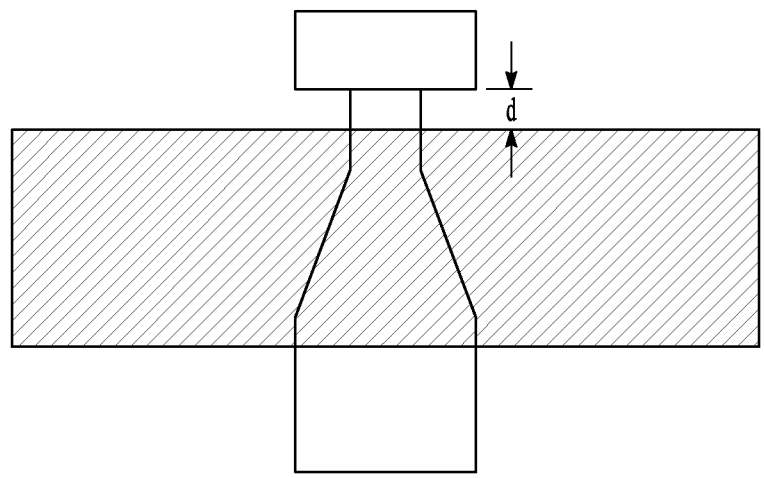
FIG. 8B illustrates a top view of a semiconductor device showing a fin structure having a tapered section, according to some embodiments of the invention.

FIG. 8B illustrates a top view of a semiconductor device showing a fin structure having a tapered section, according to some embodiments of the invention. In some embodiments, device 800 is included as a portion of device 100 shown in FIG. 1A. As shown in FIG. 8B the gate structure over the fin is located a distance "d" from a source/drain region attached to the fin.

Figure 9:
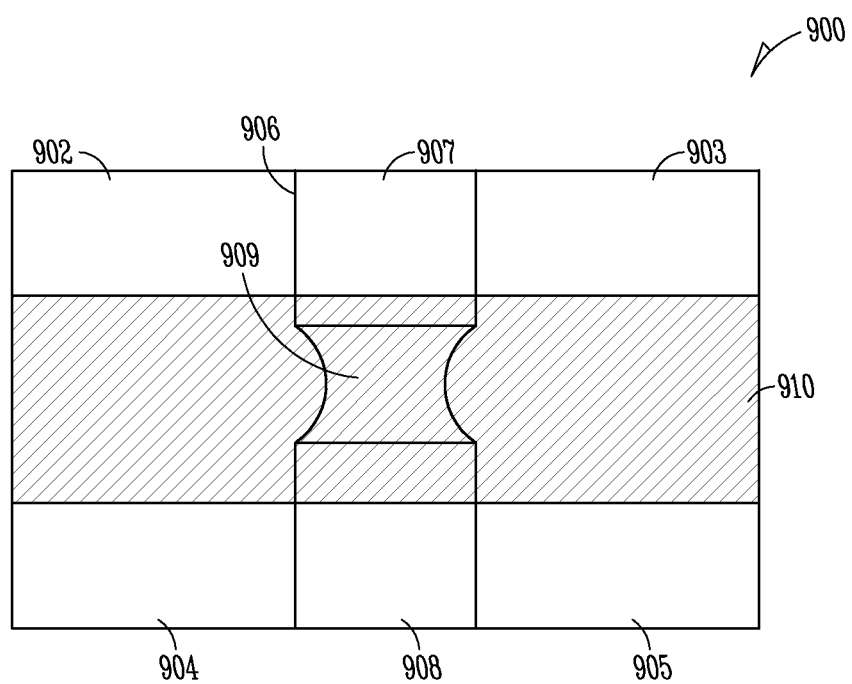
FIG. 9 illustrates a top view of a semiconductor device showing a fin structure having a curved section, according to some embodiments of the invention.

FIG. 9 illustrates a semiconductor device 900 showing a fin structure having a curved section, according to some embodiments of the invention. In some embodiments, device 900 is included as a portion of device 100 shown in FIG. 1A. In some embodiments, device 900 includes a substrate region 902-905 that supports a fin structure 906 and a gate 910. In some embodiments, fin structure 906 includes a first fin segment 907 and a second fin segment 908 coupled by a third fin segment 909. In some embodiments, the first fin segment 907 and the second fin segment 908 have approximately the same width. In some embodiments, the first fin segment 907 has a different width compared to second fin segment 908. In some embodiments, the third fin segment 909 includes a curved structure that couples the first fin segment 907 and the second fin segment 908 as shown in FIG. 9. In some embodiments, the gate 910 is disposed over a portion of fin structure 906 such that the three sides of third segment 909 formed above the substrate is covered by the gate 910. In some embodiments, the gate 910 is disposed over fin structure 906 in such a way that the gate covers a greater portion of one of the first and second segments over the other segment. In other words the gate 910 lies over the fin structure 906 in a skewed or asymmetrical manner to create an asymmetric channel. In some embodiments, the gate 910 is disposed over the fin structure 906 such that it lays over an equal portion of first fin segment 907 and a second fin segment 908. In some embodiments, the gate 910 covers part of second segment 908 and third segment 909 but not first segment 907.

Figure 10:
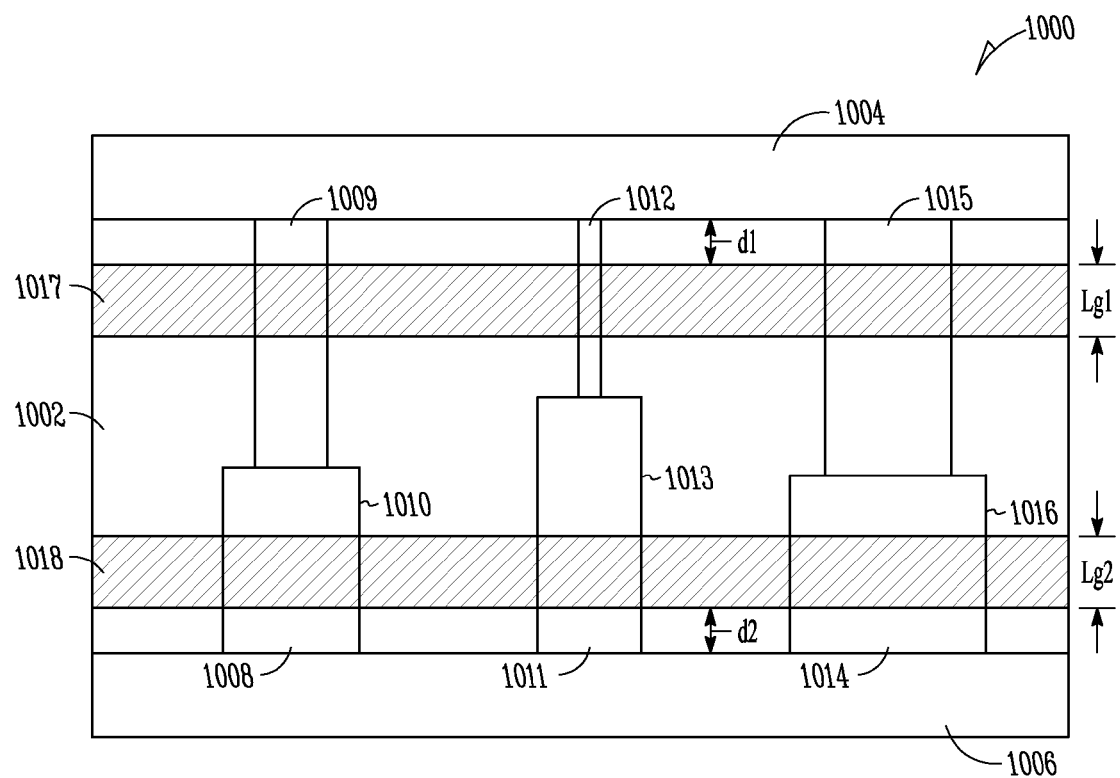
FIG. 10 illustrates a top view of a semiconductor device showing multiple fins having a stepped fin structure and multiple gates overlying the fins, according to some embodiments of the invention.

FIG. 10 illustrates a top view of a semiconductor device 1000 showing multiple fins having a stepped fin structure and multiple gates overlying the fins, according to some embodiments of the invention. In some embodiments, semiconductor device 1000 includes a substrate 1002 having a source/drain region 1006, 1004 disposed over it. Additionally, fins 1010, 1013 and 1015 are disposed on substrate 1002 and coupled between source/drain regions 1006, 1004. In some embodiments, gates 1017 and 1018 are disposed over fins 1010, 1013 and 1016. In some embodiments, gate length $Lg_1$ of gate 1017 (=part of channel length of transistor) is different compared to the gate length $Lg_2$ of gate 1018. In some embodiments, gate 1017 is disposed at a distance "d1" from source/drain region 1004. In some embodiments, gate 1018 is disposed at a distance "d2" from source/drain region 1006. In some embodiments, d1>d2. In some embodiments, d1<d2. By such an asymmetric device through an unequal distance (d1 not equal to d2) of gate to source pad and gate to drain pad, source resistance or capacitance can be lowered and additionally drain (miller-) capacitance can be lowered. In some embodiments, distance of gate 1017 to drain pad 1004 is larger than gate 1018 to source pad 1006. By that the drain gate miller capacity is reduced and the source resistance is kept low. The regions not covered by a gate and a spacer maybe receive a drain/source implant. Fin 1010 includes a first segment 1008 coupled to a second segment 1009. Similarly, fins 1013, 1016 includes first segments 1011, 1014 coupled to a second segment 1012, 1015, respectively. In some embodiments, the first segment 1008 of fin 1010 has a different width and length compared to first segment 1011 of fin 1013. In some embodiments, the second segment 1009 of fin 1010 has a different width and length compared to second segment 1012 of fin 1013.

In some embodiments, for the various embodiments described above, the top and sidewall surfaces of the fin structure can have different crystal orientation (such as indicated by the miller indices 100, 110, 010, 001, 101, etc. for crystal surface orientation) that can result in different mobility and different flicker noise when changing the fin width which can result in improved signal to noise ratio.

In some embodiments different fin widths are included in different parts of an integrated circuit and devices are connected via metallization of the used technology. Devices having different fin widths need not to be placed nearby when connected in series or parallel connection. In some parts of the integrated circuit, devices having wider fin widths maybe desired and in other parts of the integrated circuit, devices with narrower fins may be preferred.

Figure 11:
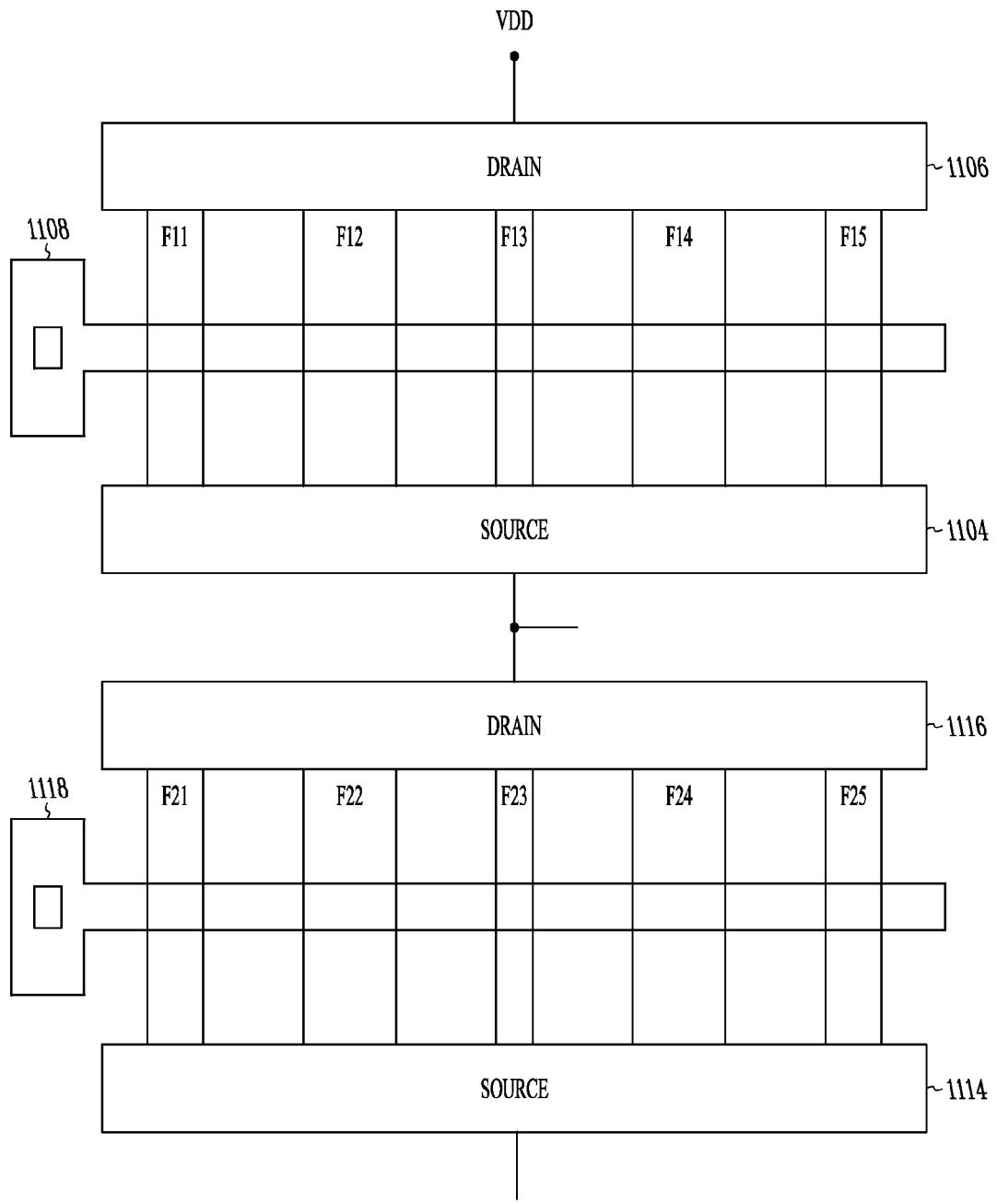
FIG. 11 illustrates a top view of two semiconductor devices coupled in series with each device having different fin widths, according to some embodiments of the invention.

FIG. 11 illustrates a top view of two semiconductor devices coupled in series with each device having different fin widths, according to some embodiments of the invention. The fins F11, F12, F13, F14 and F15 can have same fin width or different fin width but at least one fin from the group of fins F11, F12, F13, F14 and F15 has a fin width different from the fin widths of the group F21, F22, F23, F24 and F25. The same statement is valid for the group of fins F21, F22, F23, F24 and F25 with respect to the group of fins F1, F12, F13, F14 and F15.

In some embodiments more than two devices having different fin widths are connected in series (e.g. current source, mixing stage and cascode stage in a gilbert type mixer circuit).

Figure 12A:
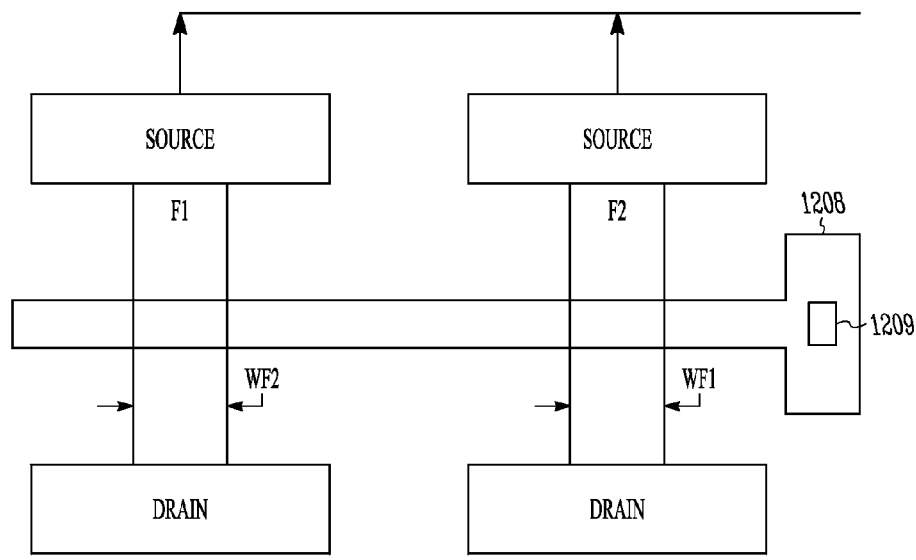
FIG. 12A illustrates a top view of two semiconductor device coupled in parallel showing a shared gate between the two devices, according to some embodiments of the invention.

FIG. 12A illustrates a top view of two semiconductor devices having different fin widths WF1 and WF2 coupled in parallel and showing a shared gate between the two devices, according to some embodiments of the invention. In some embodiments more than two devices having different fin widths are connected together in parallel. In some embodiments, one group A of fins having same fin width and connected in parallel are connected in parallel with another group B of fins having same fin widths but different from the fin width of group A. In some embodiments more than two devices with grouped fins in parallel are connected in parallel.

Figure 12B:
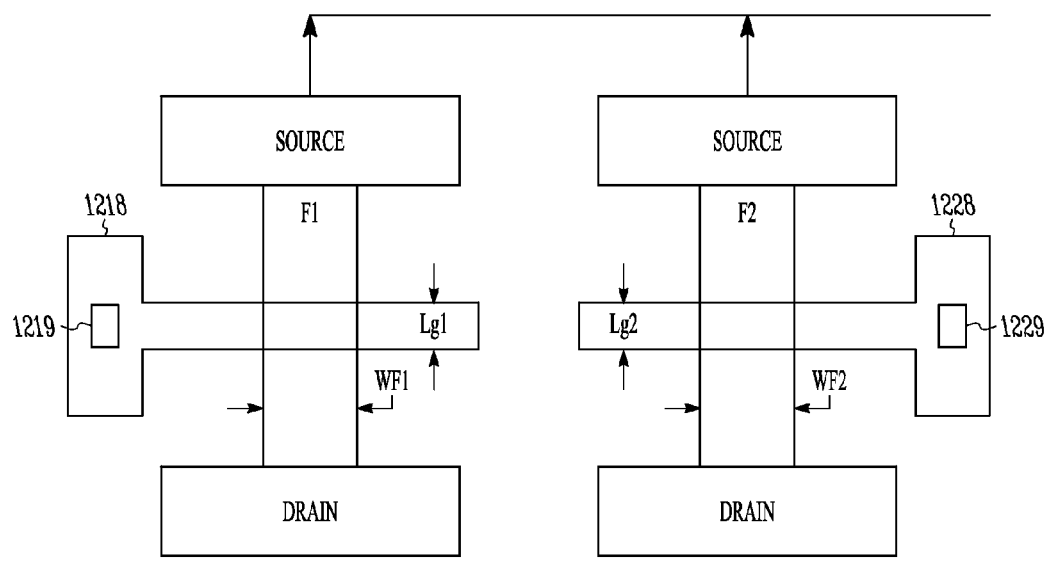
FIG. 12B illustrates a top view of two semiconductor device coupled in parallel with separate gates controlling the devices, according to some embodiments of the invention.

FIG. 12B illustrates a top view of two semiconductor devices having different fin widths WF1 and WF2 coupled in parallel with separate gates controlling the devices, according to some embodiments of the invention. In some embodiments more than two devices having different fin widths are connected together in parallel. In some embodiments, one group A of fins having same fin width and connected in parallel are connected in parallel with another group B of fins having same fin widths but different from the fin width of group A. In some embodiments more than two devices with grouped fins in parallel are connected in parallel.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ".

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A semiconductor device comprising:
   a source region;
   a drain region;
   a first fin extending between the source region and the drain region, wherein the first fin has a first fin width coupled in series with a second fin width, the second fin width different from the first fin width; and
   at least one gate to control current flow through the first fin, wherein the at least one gate overlaps the first and second fin widths,
   wherein the at least one gate has a gate length different from another gate length of the semiconductor device.

2. The semiconductor device of claim 1 wherein the series coupled fin widths have a curved shape.

3. The semiconductor device of claim 1 wherein the series coupled fin widths have a tapered shape.

4. The semiconductor device of claim 1 including a second fin connected in parallel with the first fin between the source region and the drain region.

5. The semiconductor device of claim 1, wherein the gate length is longer than the another gate length for a wider corresponding fin width.

6. The semiconductor device of claim 4 and further comprising a gate contact, wherein the gate length and fin width increases as a function of distance from the gate contact.

7. The semiconductor device of claim 1 wherein the gate length is shorter than the another gate length for a wider corresponding fin width.

8. The semiconductor device of claim 1 and further comprising a pair of gate contacts disposed on opposite sides of the at least one gate.

9. The semiconductor device of claim 4 and further comprising a gate contact, wherein the gate length and fin width decreases as a function of distance from the gate contact.

10. The semiconductor of claim 1, wherein the at least one gate overlaps the at least two different fin widths asymmetrically.

11. The semiconductor of claim 1, wherein the at least one gate is a split gate including:
    a first segment disposed over a first fin width;
    a second segment disposed over a second fin width;
    and an opening, defined by the first segment and the second segment, disposed over an area of the fin where fin edges corresponding to the first fin width meet fin edges corresponding to the second fin width.

12. The semiconductor of claim 11, wherein the opening is disposed asymmetrically over the area where the fin edges corresponding to the first fin width meet the fin edges corresponding to the second fin width.

13. The semiconductor device of claim 1, wherein the first fin width is positioned under a gate length of the at least one gate, the second fin width is positioned under a first edge of the gate length, a third fin width is positioned under a second edge of the gate length, and the the second fin and the third fin width are less than the first fin width to reduce flicker noise.

14. The semiconductor device of claim 13, wherein the second fin width is substantially equal to the third fin width.

15. A method comprising:
forming a source and a drain region;
forming a fin extending between the source region and the drain region, wherein the fin includes a plurality of different fin widths coupled in series; and
forming a gate to control current flow through the fin, wherein forming the gate includes disposing the gate over at least two different fin widths of the plurality of different fin widths,
wherein two fin widths of the plurality of fin widths differ by at least 4 nm.

16. The method of claim 15 wherein the plurality of different fin widths are formed as a function of layout of the fin.

17. The method of claim 15 wherein the plurality of different fin widths are formed through the use of locally varying printing resolution.

18. The method of claim 15 wherein the forming a fin includes forming a fin extending between the source region and the drain region, wherein the fin includes a plurality of different fin widths that vary in width by more than 4 nm.

19. The method of claim 15, wherein disposing the gate includes disposing the gate asymmetrically over an area of the fin where fin edges corresponding to the first fin width meet fin edges corresponding to the second fin width.

20. The method of claim 15, wherein the forming the gate includes forming a split gate, wherein forming the split gate includes:
forming a first segment of the split gate over a first fin width of the fin;
forming a second segment of the split gate over a second fin width of the fin; and
positioning an opening of the split gate, the opening defined by the first segment and the second segment, over an area of the fin where fin edges corresponding to the first fin width meet fin edges corresponding to the second fin width.

21. The method of claim 20, wherein positioning an opening includes positioning the opening of the split gate asymmetrically over the area of the fin where the fin edges corresponding to the first fin width meet the fin edges corresponding to the second fin width.

* * * * *